United States Patent
Li (10) Patent No.: US 10,263,639 B2
(45) Date of Patent: Apr. 16, 2019

(54) MANAGING SOFT INFORMATION IN HIGH-CAPACITY SOLID STATE DRIVE

(71) Applicant: Alibaba Group Holding Limited, George Town (KY)

(72) Inventor: Shu Li, Bothell, WA (US)

(73) Assignee: Alibaba Group Holding Limited (KY)

( * ) Notice: Subject to any disclaimer, the term of this patent is extended or adjusted under 35 U.S.C. 154(b) by 0 days.

(21) Appl. No.: 15/426,725

(22) Filed: Feb. 7, 2017

(65) Prior Publication Data

US 2018/0226990 A1  Aug. 9, 2018

(51) Int. Cl.
| | | |
|---|---|---|
| H03M 13/00 | (2006.01) | |
| H03M 13/11 | (2006.01) | |
| G06F 11/10 | (2006.01) | |
| G11C 29/52 | (2006.01) | |
| G06F 3/06 | (2006.01) | |
| G11C 29/02 | (2006.01) | |
| G11C 29/04 | (2006.01) | |

(52) U.S. Cl.
CPC ......... *H03M 13/1111* (2013.01); *G06F 3/064* (2013.01); *G06F 3/0619* (2013.01); *G06F 3/0679* (2013.01); *G06F 11/1068* (2013.01); *G11C 29/028* (2013.01); *G11C 29/52* (2013.01); *G11C 2029/0409* (2013.01)

(58) Field of Classification Search
None
See application file for complete search history.

(56) References Cited

U.S. PATENT DOCUMENTS

| | | | |
|---|---|---|---|
| 5,734,622 A | 3/1998 | Furumochi | |
| 5,756,981 A | 5/1998 | Roustaei | |
| 6,381,726 B1 | 4/2002 | Weng | |
| 7,844,879 B2 | 11/2010 | Ramamoorthy | |
| 8,051,363 B1 | 11/2011 | Liu | |
| 8,413,010 B1 | 4/2013 | Vasquez | |
| 9,047,213 B2 * | 6/2015 | Marrow | G06F 11/1072 |
| 2002/0159546 A1 * | 10/2002 | Fulghum | H03M 13/3738 375/341 |
| 2010/0037121 A1 | 2/2010 | Jin | |
| 2011/0191653 A1 * | 8/2011 | Zeng | H03M 13/1111 714/763 |
| 2013/0163328 A1 | 6/2013 | Karakulak | |
| 2014/0281823 A1 * | 9/2014 | Micheloni | G06F 11/1012 714/773 |
| 2015/0074488 A1 * | 3/2015 | Pream | G06F 11/108 714/759 |
| 2015/0089330 A1 * | 3/2015 | Xia | G06F 11/1008 714/773 |

(Continued)

*Primary Examiner* — Daniel F. McMahon
(74) *Attorney, Agent, or Firm* — Van Pelt, Yi & James LLP (57) ABSTRACT

A technique for managing soft information decoding for a solid state drive (SSD) is disclosed. The technique includes performing soft decoding of data read from an SSD using at least some of a plurality of soft information tables and monitoring a set of one or more soft information properties associated with the plurality of soft information tables. The technique also includes adjusting the at least some of the plurality of soft information tables based at least in part on the set of the one or more soft information properties and repeating the soft decoding of data read from the SSD using at least the one or more adjusted soft information tables.

26 Claims, 10 Drawing Sheets

(56) References Cited

U.S. PATENT DOCUMENTS

| | | | |
|---|---|---|---|
| 2015/0178154 A1* | 6/2015 | Kim | G06F 11/1048 |
| | | | 714/758 |
| 2016/0274969 A1* | 9/2016 | Chen | H03M 13/45 |
| 2014/0040704 A1 | 2/2017 | Wu | |
| 2017/0269993 A1* | 9/2017 | Maffeis | G11C 29/52 |

* cited by examiner

MANAGING SOFT INFORMATION IN HIGH-CAPACITY SOLID STATE DRIVE

BACKGROUND OF THE INVENTION

Solid State Drives (SSDs) are commonly implemented using NAND flash storage. High-density NAND flash elements such as three-dimensional (3D) triple-level cell (TLC) flash or 3D quadruple-level cell (QLC) flash are often used in high-capacity and low-cost SSD products. The high-density flash elements often have high raw error rates, and therefore typically require low-density parity-check (LDPC) code for making error correction. Existing LDPC decoders typically store a fixed set of soft information tables to facilitate the decoding operation. Since there are variations in physical properties in the cells of different flash elements and as well in the same cell as the cell ages, using fixed soft information tables for soft decoding may not yield accurate result.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
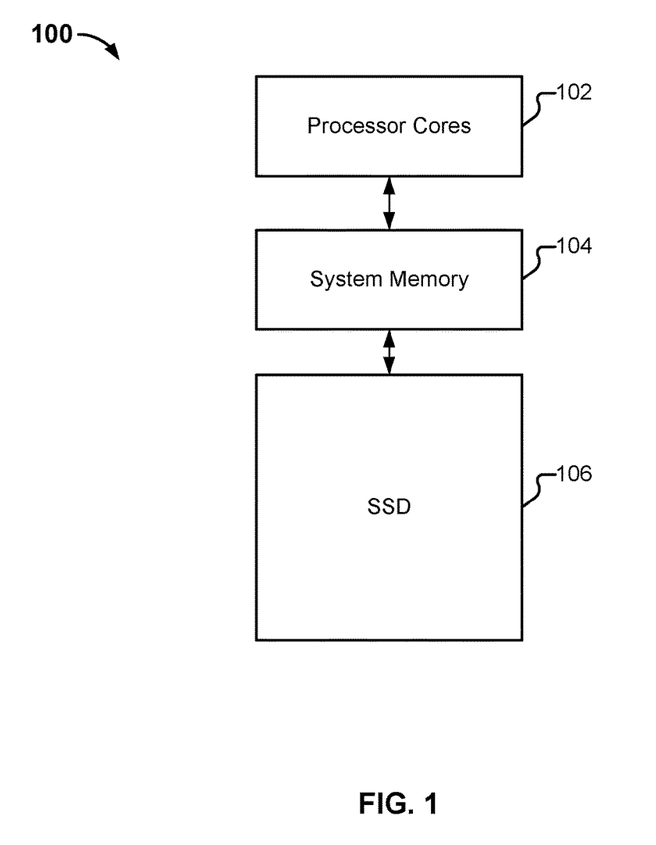
FIG. 1 is a block diagram illustrating an embodiment of a storage system.

FIG. 1 is a block diagram illustrating an embodiment of a storage system. System 100 includes a host portion which includes one or more processors 102 and one or more system memories (also referred to as host memories) 104 configured to provide the processors with instructions. The host portion is coupled to a solid state drive portion using appropriate interconnects such as Peripheral Component Interconnect Express (PCIe) lanes. Although a single SSD 106 is shown for purposes of illustration, multiple SSDs (including a single type or multiple types of SSDs) can be included in various embodiments. For example, one or more PCIe SSDs and/or one or more serial attached SCSI/serial AT attachment (SAS/SATA) SSDs can be included in the SSD portion. Many other components such as input/output components, networking components, etc., can be included in system 100 but are omitted from the figure.

Figure 2:
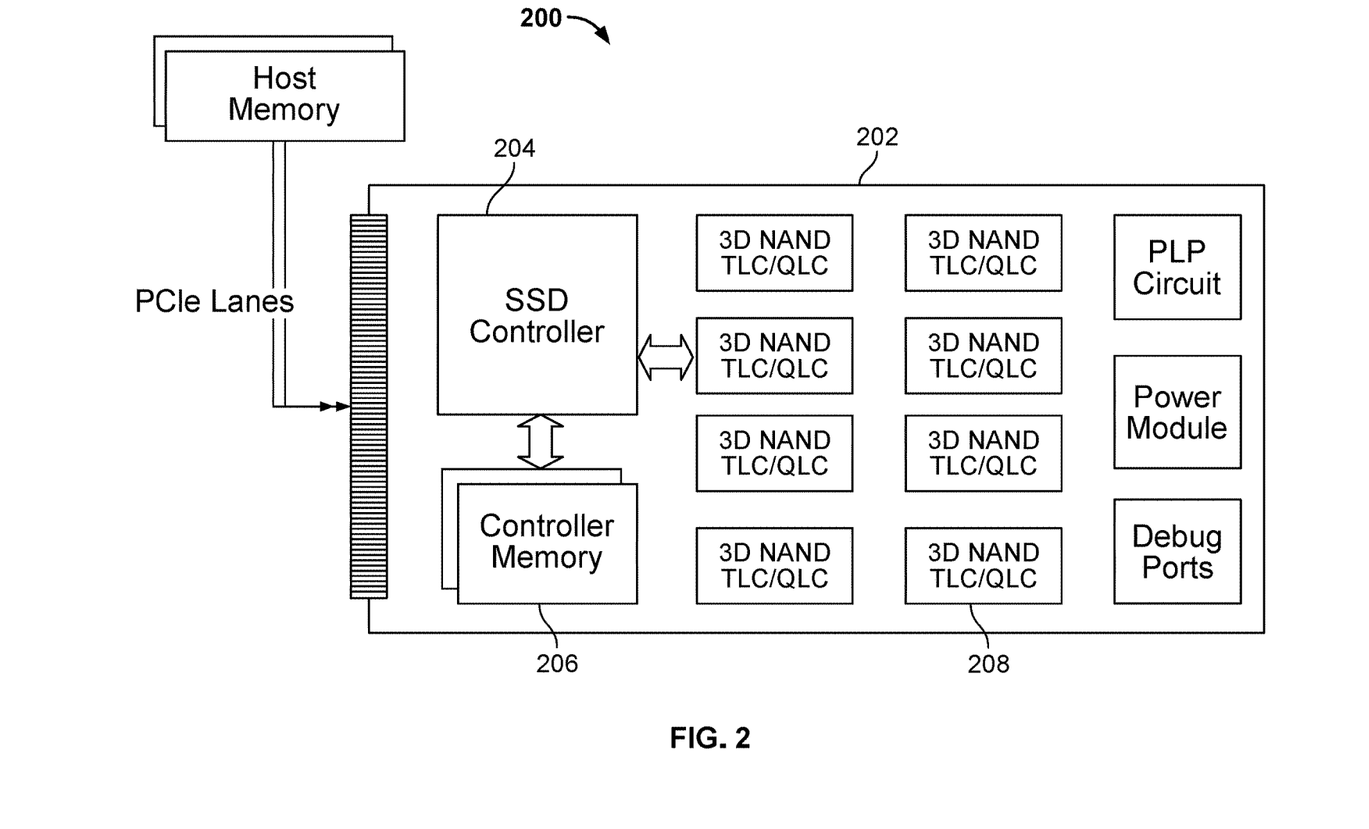
FIG. 2 is a block diagram illustrating another embodiment of a storage system.

FIG. 2 is a block diagram illustrating another embodiment of a storage system. In system 200, details of an SSD 202 are shown. An SSD controller 204 is coupled to controller memory 206, and to high-density NAND flash elements 208. SSD controller 204 can be implemented using one or more microprocessors, standard processors, or the like, to execute code that monitors and controls the operations of the high-density NAND flash elements. The high-density NAND flash elements incorporate 3-dimensional stacked design, such as 3D triple level cell (TLC) flash, 3D quadruple level cell (QLC) flash, etc.

In the examples above, the SSDs are implemented using NAND flash. A NAND flash memory cell has floating gate. The amount of electrons trapped in the floating gate can change the threshold voltage ($V_{th}$) of the cell. In a NAND flash memory cell that stores a single bit, when the floating gate is charged (in other words, when electrons are trapped in the floating gate), the cell has higher threshold voltage and is regarded as corresponding to a programmed logical value of "0." When the floating gate is discharged, the cell has a lower threshold voltage and is regarded as corresponding to a programmed logical value of "1." To read a value from a memory cell, an intermediate voltage (also referred to as a sensing voltage or applied voltage) is applied to the cell's control gate. If the cell's channel conducts at this intermediate voltage, then the threshold voltage of the cell is deemed to be below the intermediate voltage and the floating gate is deemed to be uncharged. The cell is therefore deemed to store a logical value of "1." If the cell's channel does not conduct at this intermediate voltage, then the threshold value of the cell is deemed to be above the intermediate voltage and the floating gate is deemed to be charged. The cell is therefore deemed to store a logical value of "0."

Figure 3A:
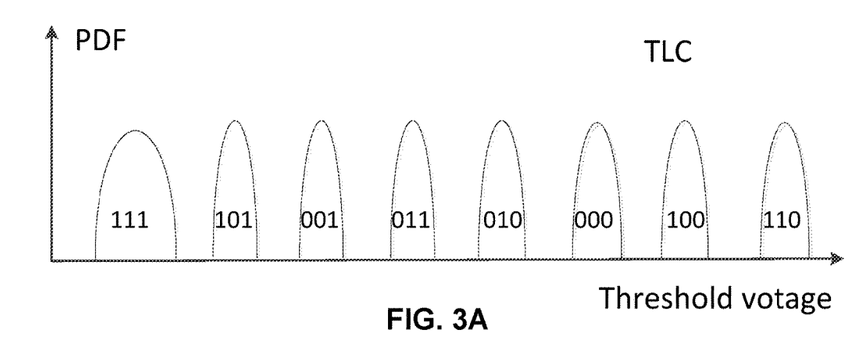
FIGS. 3A and 3B are diagrams illustrating the distributions of threshold voltages corresponding to different programmed logical values.
Figure 3B:
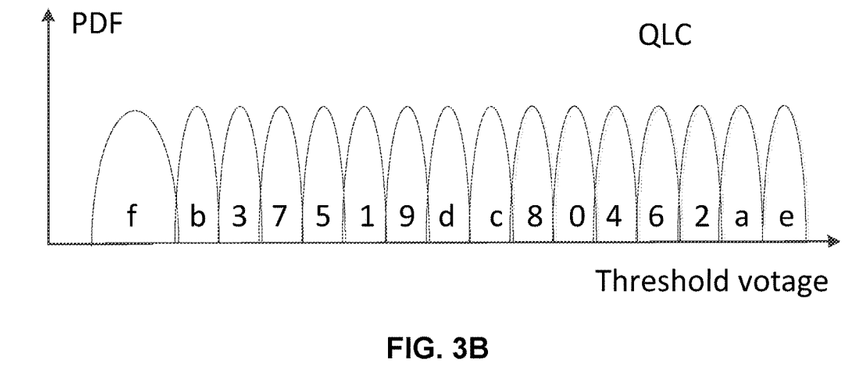

In a high-density NAND flash cell, the floating gate stores different levels of charge to represent different programmed values, therefore yielding different threshold voltages. FIGS. 3A and 3B are diagrams illustrating the distributions of threshold voltages corresponding to different programmed logical values. The distribution of threshold voltages for TLC flash, which stores three bits per cell, is shown in FIG. 3A. The distribution of threshold voltages for QLC flash, which stores four bits per cell, is shown in FIG. 3B. In the examples shown, the stored logical values are encoded using Gray code to ensure a single bit transition between adjacent threshold ranges. The distance between the centers of two neighboring distributions is referred to as a range. In FIG. 3B, fifteen ranges are shown.

The high-density NAND flash employs low-density parity-check (LDPC) code for making error correction. LDPC decoding employs soft information to improve error correction performance. As used herein, soft information refers to the probabilistic information associated with a logical value read from the flash. Specifically, for a given read (e.g., sensed) voltage, the soft information indicates the likelihood that the sensed voltage corresponds to a specific value. In some embodiments, the soft information is represented using a log likelihood ratio (LLR). Other representations such as percentage can also be used.

Figure 4:
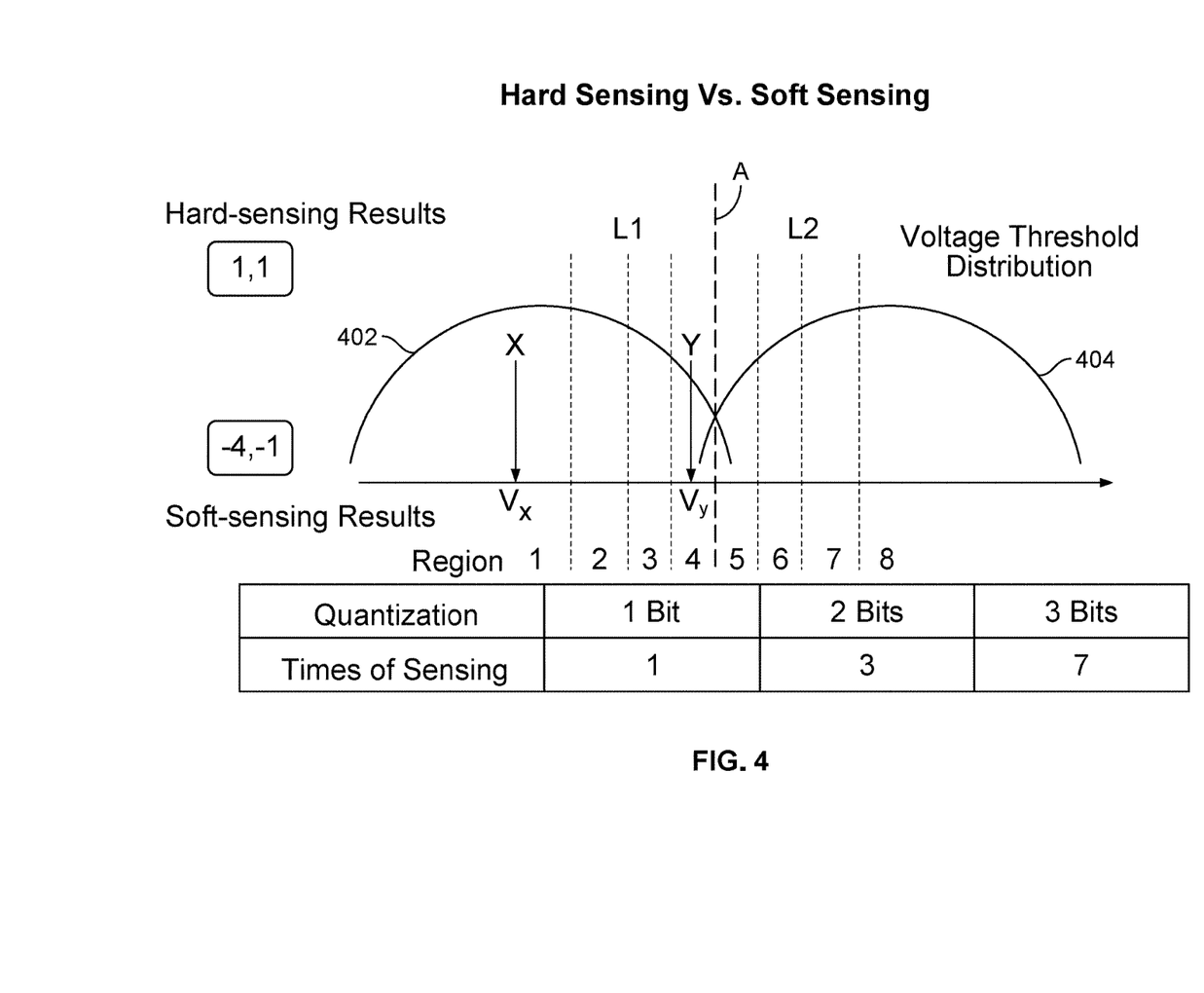
FIG. 4 is a diagram illustrating a hard sensing example juxtaposed with a soft sensing example.

Examples of hard sensing and soft sensing are described for purposes of illustrating the principles of these sensing techniques. FIG. 4 is a diagram illustrating a hard sensing example juxtaposed with a soft sensing example. In this example, two overlapping distribution curves 402 and 404 correspond to two neighboring logical values L1 and L2, respectively. L1 and L2 can be logical value pairs such as "f" and "b," "b" and "3," etc., shown in FIG. 3B. A sensing voltage A divides the voltage ranges into two ranges corresponding to two adjacent logical values L1 and L2, respectively. During a read operation, voltage A is applied to a cell's control gate, and the cell will either conduct (indicating that the threshold voltage of the cell is below the applied voltage, and that the programmed logical value corresponds to L1), or not conduct (indicating that the threshold voltage of the cell is higher than the applied value, and the programmed logical value corresponds to L2). As shown, stored data X and Y have corresponding threshold voltages $V_x$ and $V_y$. Since a single read is performed in hard sensing, the cell will conduct because both threshold voltages are below the applied voltage. The hard sensing result is that the stored logical value in both cases corresponds to logical value L1.

As can be seen from FIG. 4, it is quite possible that Y is actually attributed to a threshold voltage that corresponds to distribution curve 404 (logic value L2). Soft sensing is used to more precisely determine the likelihood that a sensed value actually corresponds to a particular logical value. In contrast, soft sensing uses seven sensing voltage levels that divide the range of threshold voltage (R) into eight regions. Multiple reads can be required to find the threshold voltage region in which the threshold voltage of particular stored data lies. As shown, data X is in region 1, which indicates a high likelihood (e.g., an LLR of a) that X corresponds to a stored logical value L1, and data Y is in region 4, which indicates a lower likelihood (e.g., an LLR of b, where b>a) that Y corresponds to L1 and a similar likelihood that Y corresponds to L2.

The soft information is used in LDPC decoding to improve accuracy. Any appropriate techniques for applying soft information in an LDPC decoding algorithm can be used. To obtain the soft information associated with a soft sensing result, one or more soft information tables can be used to determine the soft information associated with a specific sensed value. Table 1 illustrates a soft information table example. As shown, the table includes fifteen rows (corresponding to the fifteen ranges between adjacent distribution curves) and eight columns (corresponding to eight regions within each range), and each entry is the LLR of the corresponding soft information. The entry values are for purposes of example only and different values may be used in other tables. To determine soft information based on a sensed voltage, the range and region corresponding to the sensed voltage are used as indexes into the table to look up a specific piece of soft information. Although eight regions are used for purposes of example, different numbers of regions can be used in other embodiments, which would result in tables of different sizes. Further, although a table data structure is used for purposes of illustration, other appropriate data structures and/or formats such as lists, trees, etc. can also be used.

TABLE 1

|  | Region 1 | Region 2 | Region 3 | Region 4 | Region 5 | Region 6 | Region 7 | Region 8 |
|---|---|---|---|---|---|---|---|---|
| Range 1 | 3 | 2 | 1 | −0.1 | −0.3 | −5 | −8 | −9 |
| Range 2 | 4 | 6 | 1 | −2 | −4 | −7 | −9 | −9.8 |
| Range 3 | ... | ... | | | | | | |
| Range 4 | ... | | | | | | | |
| Range 5 | | | | | | | | |
| Range 6 | | | | | | | | |
| Range 7 | | | | | | | | |
| Range 8 | | | | | | | | |
| Range 9 | | | | | | | | |
| Range 10 | | | | | | | | |
| Range 11 | | | | | | | | |
| Range 12 | | | | | | | | |
| Range 13 | | | | | | | | |
| Range 14 | | | | | | | | |
| Range 15 | | | | | | | | |

Furthermore, the soft information table can vary given different operational data. For example, measurements and testing show that operational conditions and/or parameters such as the variations in cell location, the amount of time that has lapsed since the cell is programmed, the number of program/erase (P/E) cycles a cell has experienced, read disturbs (e.g., amount of unwanted changes to cells due to the reading of neighboring cells), write disturbs (e.g., amount of unwanted change to cells due to the writing of neighboring cells), data retention rate (e.g., error rate after retaining data for a period of time), calibration (e.g., configuring and tuning the device), etc. can affect the LLR of a sensed voltage. Other operational data can be measured and accounted for. Thus, it is common for the SSD manufacturer to perform a characterization process that tests different combinations of operational data and generates multiple soft information tables corresponding to these combinations of operational data. Table 2 illustrates an example of a mapping table storing operational data to corresponding identifiers of soft information tables. Such a mapping table or any other appropriate database can be established, and APIs are provided to look up a corresponding soft information table identifier given a set of operational data. In some embodiments, if no corresponding soft information table identifier is found in the mapping table, the soft information table identifier that maps to the closest proximate operational data is returned.

TABLE 2

| Operational Data (P/E cycles, read disturbs, write disturbs, data retention rate, calibration) | Soft Information Table Identifier |
|---|---|
| (100, 10, 10, 50, 50) | T1 |
| (150, 10, 10, 50, 50) | T2 |
| . . . | . . . |
| (400, 10, 10, 50, 50) | T7 |
| . . . | . . . |
| (300, 50, 60, 90, 80) | T92 |
| . . . | . . . |

In some embodiments, the SSD manufacturer provides a function call that will produce the appropriate soft information table when given a set of operational data as input to the function call. In some embodiments, the operational data and the tables are stored as key-value pairs, so that a specific table can be located using a set of operational data as a key. In some embodiments, the tables are stored in hierarchical memory and accessed according to a content addressable memory (CAM) scheme in which the content corresponds to the operational data and the memory address corresponds to the location of the corresponding soft information table. The CAM-based storage is discussed in greater detail in connection with FIG. 6.

Figure 5:
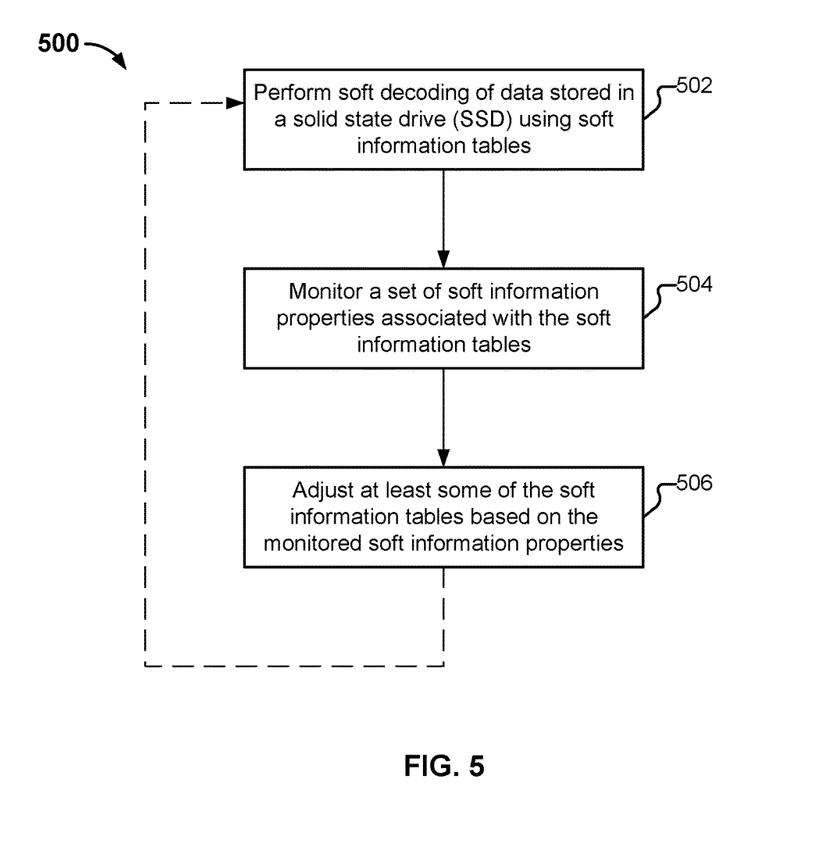
FIG. 5 is a diagram illustrating a process for using the soft information tables.

Multiple soft information tables can be generated for different operational data (e.g., based on testing under different operational conditions and recording observations given these operational conditions). The soft information tables can be stored and used during the decoding process. FIG. 5 is a diagram illustrating a process for using the soft information tables. Process 500 can be performed by a controller such as 204 of FIG. 2.

At 502, soft decoding of data stored in a solid state drive (SSD) is performed. At least some of a plurality of soft information tables are used during the soft decoding. The soft information tables can be default tables or previously saved tables read from the SSD's storage, as well as tables buffered in memory. 502 can be performed in response to the SSD's read operations. In particular, data is read from the SSD by sensing the threshold voltage of the cell of the flash element. Current operational data is also obtained by monitoring operational conditions, querying statistics trackers and/or counters, etc. Operational data such as P/E cycles, read disturbs, write disturbs, data retention, calibration, etc. are determined using appropriate API calls provided by the SSD manufacturer or the like. In some embodiments, given a sensed voltage and current operational data associated with the sensed voltage, a corresponding soft information table is located in a hierarchical storage (e.g., a hierarchical organization of memory buffers). The implementation of the hierarchical storage and how to store the soft information tables are discussed in greater detail below in connection with FIG. 6.

At 504, a set of one or more soft information properties associated with the plurality of soft information tables is monitored. 504 can be executed after 502 or concurrently with 502. Separate threads or processes can be used to execute 502 and 504. In this example, the soft information properties include access frequency measuring how frequently the soft information tables are accessed. For example, the controller can maintain metadata such as a counter for each soft information table, and increment the corresponding counter each time a soft information table is accessed. The soft information properties can also include operational data described above, which can be determined, for example, using APIs provided by the SSD manufacturer or the like.

At 506, based at least in part on the monitored soft information properties, at least some of the soft information tables are adjusted.

In this example, the soft information properties include access frequencies of the soft information tables, and the adjustment of the soft information tables includes moving the locations of at least some of the soft information tables in a hierarchical storage. Specifically, the soft information tables are ranked based on their respective access frequencies (e.g., counter values), and placed according to the ranking. More frequently accessed soft information tables can be promoted to locations in the hierarchical storage that have faster access time/lower latency, and less frequently accessed soft information tables can be demoted into locations in the hierarchical storage that have slower access time/higher latency. The performance of soft information table retrieval is therefore improved. A detailed example of a hierarchical storage is discussed in connection with FIG. 6.

In this example, the soft information properties also include operational data. Based on soft decoding results from 502, existing soft information tables can be modified, and new soft information tables can be added. For example, based on the current operational data, a corresponding soft information table is located (e.g., looking up in a mapping table such as Table 2). Based on the range and region of measured data, a corresponding LLR is located in the soft information table (e.g., looking up in a soft information table such as Table 1). When the LLR is applied to a decoder (e.g., a conventional LDPC decoder), the soft decoding operation will return an indication of failure or success. If the soft decoding operation fails, then the LLR value is not suitable for the given operational conditions and needs to be tuned. The LLR is adjusted (e.g., increased or decreased by a preset amount) and reapplied to the decoder. If the decoding result indicates a success, then the LLR entry in the soft information table is changed to the adjusted LLR that resulted in the success. If the decoding result still indicates a failure, the LLR is adjusted again and reapplied to the decoder. The LLR-adjustment and decoding process is repeated until the decoding is done. If the process fails after several rounds of decoding retries and/or if the time for decoding runs out, a decoding failure is reported to the host, and the host can use other methods to recover data, such as copying from a backup.

The updated soft information tables are provided to the soft decoder to be used in soft decoding, and process 500 can be repeated at pre-specified intervals to continuously adjust the soft information tables, provide more accurate soft information, and improve decoding quality.

In some embodiments, the soft information tables generated by the manufacturer are preferably stored in non-volatile memory such as the SSD so that they are persisted even after a power cycle. Retrieving the soft information tables from the SSD as needed, however, involves high latency and can be impractical when a high number of soft information tables are needed to perform soft decoding under a multitude of conditions. In some embodiments, a hierarchical storage is configured to buffer some of the soft information tables in memory. As discussed in FIG. 6 below, a great number of soft information tables are stored in the SSD to achieve better decoding accuracy and a small number of soft information tables are stored in the RAM or cache memory of the controller to achieve lower latency.

Figure 6:
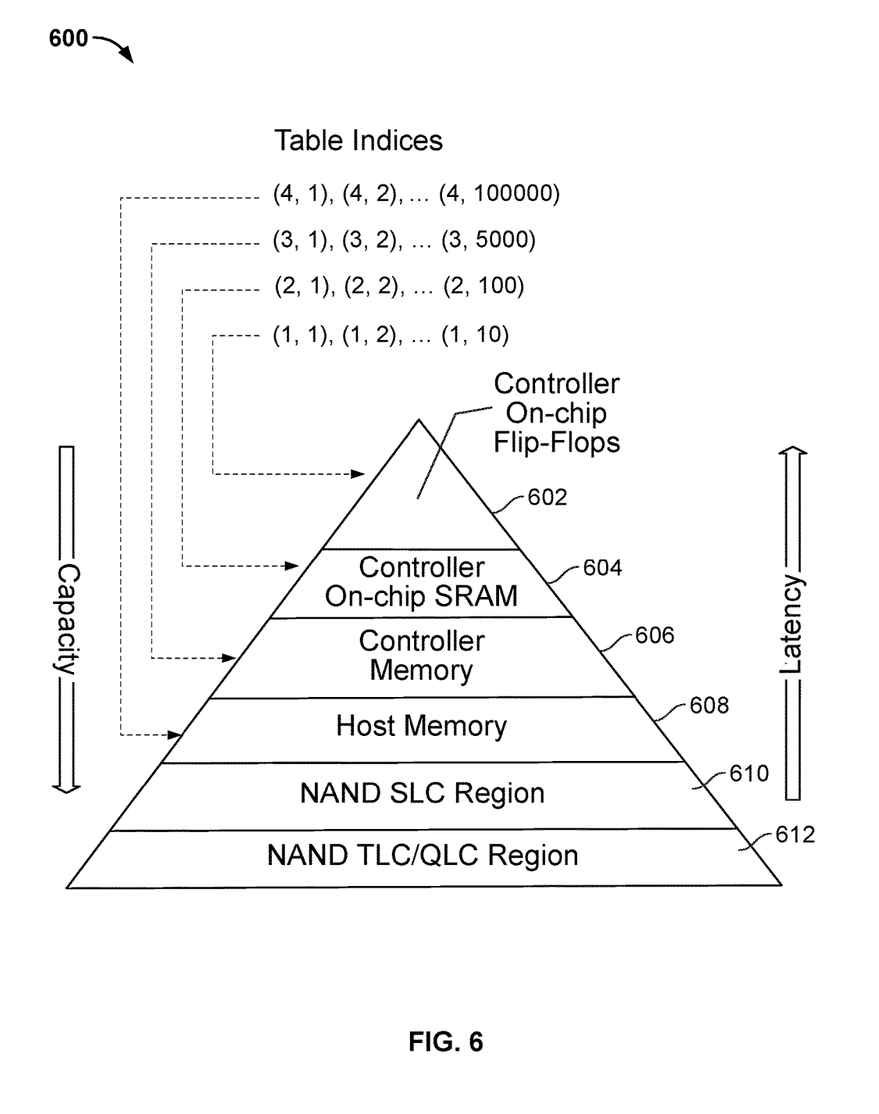
FIG. 6 is a block diagram illustrating an embodiment of a hierarchical storage configured to store soft information.

FIG. 6 is a block diagram illustrating an embodiment of a hierarchical storage configured to store soft information. Hierarchical storage 600 illustrates the logical hierarchy of the storage elements used. From the highest level (which has the least latency as well as least capacity) to the lowest level (which has the highest latency as well as capacity), the hierarchical storage includes a buffer portion and a persistent storage portion. The buffer portion includes the controller's on-chip flip-flops (602), the controller's on-chip SRAM (604), the controller memory (606), and the host memory (608). The persistent storage portion includes the NAND device's single level cell (SLC) region (610) and the NAND device's TLC/QLC region (612).

In the buffer portion, the first tier includes a portion of the controller's on-chip flip-flops 602. The first tier is located the closest to the soft information generator (e.g., the controller's microprocessor), and has the lowest latency (e.g., a response time of 1 clock cycle); however, the first tier also has very limited capacity. The second tier includes a portion of the controller's on-chip SRAM 604. The second tier has somewhat higher latency (e.g., a response time on the order of nanoseconds) and greater capacity (e.g., several Kilobytes (KB)) than the first tier. The third tier includes a portion of the controller memory (e.g., the on-board DRAM). The third tier has higher latency (e.g., a response time on the order of tens of nanoseconds) and greater capacity (e.g., several Megabytes (MB)) than the second tier. The fourth tier includes a portion of the host's memory and has significant amount of capacity (e.g., on the order of Gigabytes (GB)).

The persistent storage portion includes an SLC region and a TLC/QLC region. Due to the high latency for accessing the flash regions, the persistent storage portion is used to persist (store) soft information tables between power cycles.

As discussed above in connection with FIG. 5, the soft information properties include the access frequencies of the soft information tables. The access frequencies of the tables are evaluated (e.g., ranked) periodically or at specified intervals. The tables are placed into a storage hierarchy according to their access frequency rankings, such that the more frequently accessed tables are stored in a storage location with lower access latency (e.g., 602), and the less frequently accessed tables are stored in a storage location with higher access latency (e.g., 612). The counters are then reset. When the access frequencies are reevaluated, tables that have become more frequently accessed can be promoted into a lower latency storage, and tables that have become less frequently accessed can be demoted into a higher latency storage.

In some embodiments, the addresses of tables in the hierarchical storage are represented using indices. In one example, an index includes two values, one indicating the hierarchical level of the storage, and one indicating the location of the table within the hierarchy. As shown in the example in FIG. 6, suppose that the on-chip flip-flops 602 have enough space to store 10 tables, then the indices of the tables stored within the on-chip flip-flops are represented as (1, 1), (1, 2), (1, 3), . . . , and (1, 10); suppose that the on-chip SRAM 604 has enough space to store 100 tables, then the indices of the tables stored within the on-chip SRAM are represented as (2, 1), (2, 2), (2, 3), . . . , and (2, 100); and so on.

Accordingly, the soft information tables can be stored using a content addressable memory scheme in which locations of soft information tables are addressable using operational data. Each table has an index indicating the location of the corresponding table in the storage hierarchy. The operational data forms the content, which points to an index. The index is an entry to a CAM. Table 3 is an example table implementing such a CAM. To look up a soft information table that corresponds to a set of operational data (e.g., P/E=150, read disturbs=10, write disturbs=10, data retention rate=50, calibration=50), the CAM is queried using the operational data, and an index indicating the location of the table in the storage hierarchy is returned. In this example, the index is (3, 629), indicating that the corresponding soft information table is stored in the third level in the hierarchy (controller memory 606), at the 629th table location.

TABLE 3

| Operational Data (P/E cycles, read disturbs, write disturbs, data retention rate, calibration) | Soft Information Table Index |
| --- | --- |
| (100, 10, 10, 50, 50) | (2, 25) |
| (150, 10, 10, 50, 50) | (3, 629) |
| . . . | . . . |
| (400, 10, 10, 50, 50) | (1, 7) |
| . . . | . . . |
| (300, 50, 60, 90, 80) | (2, 18) |
| . . . | . . . |

Figure 7A:
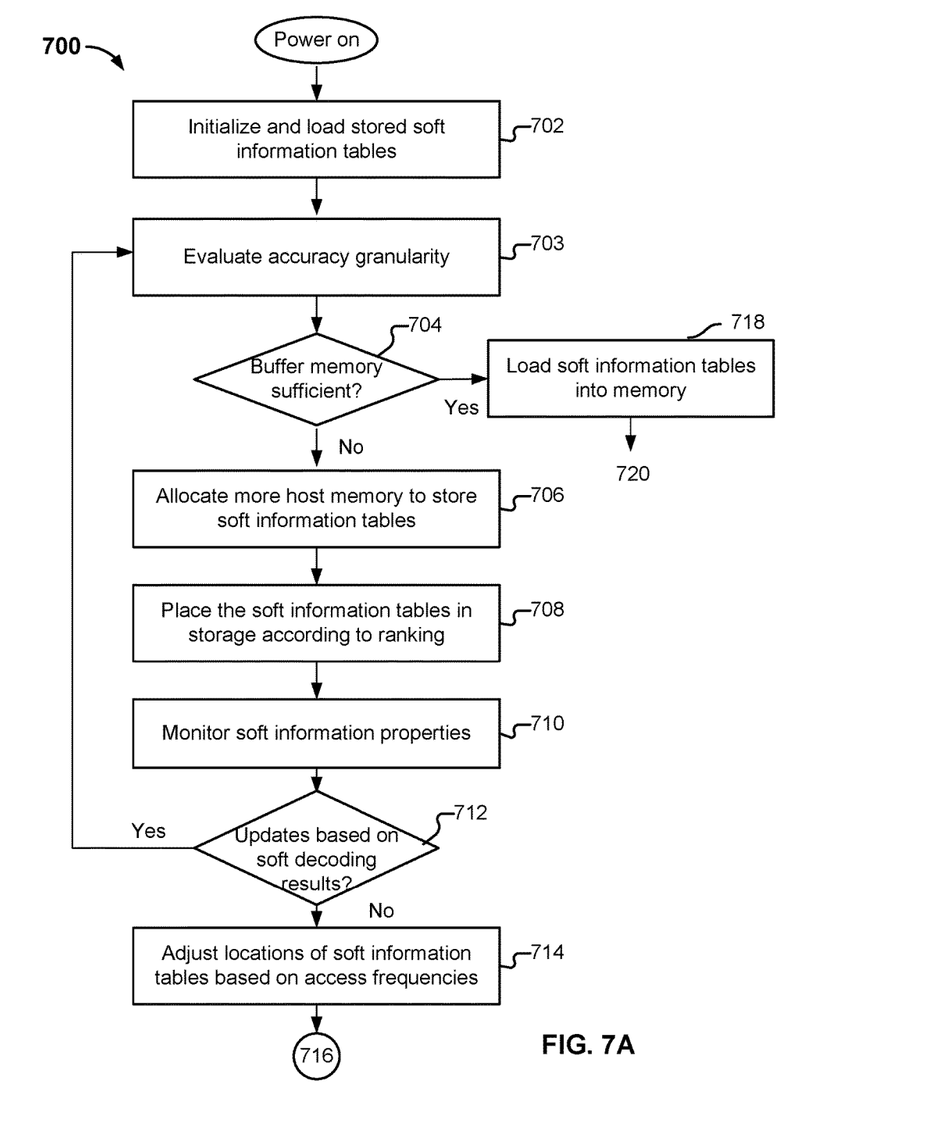
FIGS. 7A-7B are a flowchart illustrating an embodiment of a process for managing the soft information tables during a power cycle.
Figure 7B:
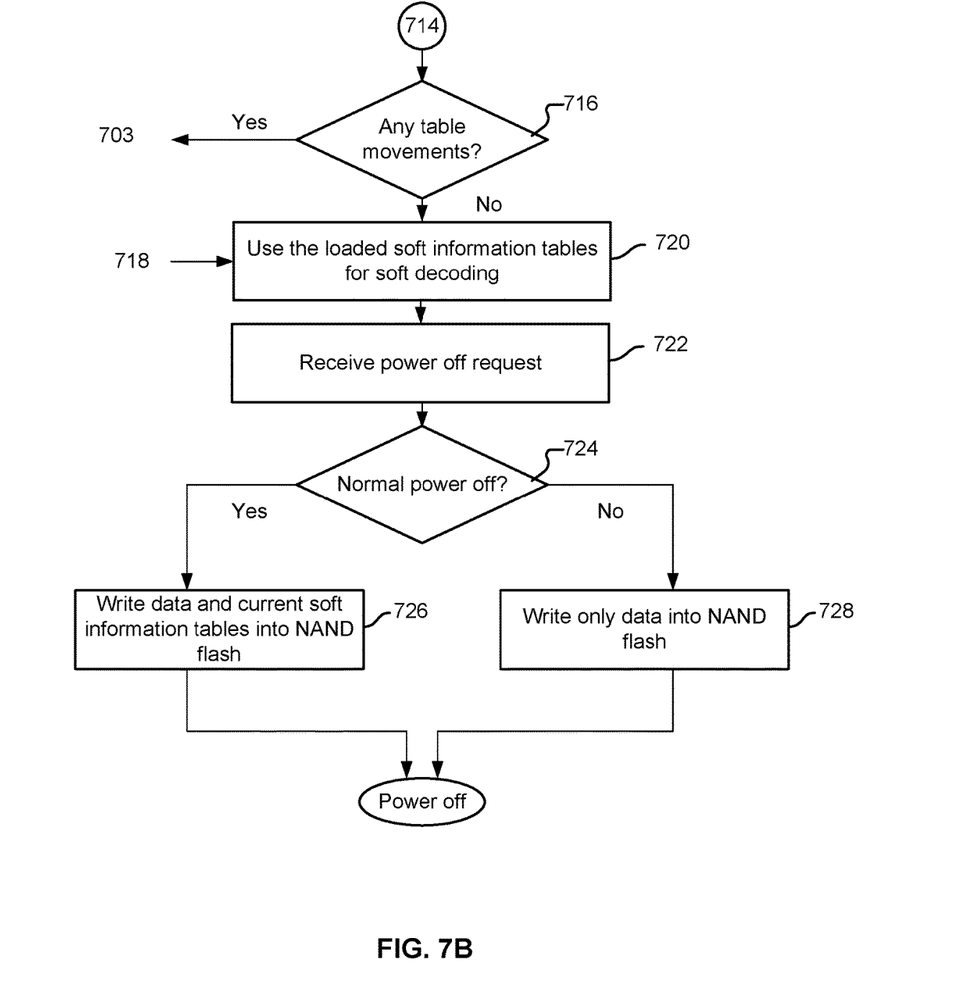

FIGS. 7A-7B are a flowchart illustrating an embodiment of a process for managing the soft information tables during a power cycle. Process 700 can be performed by a system such as 200.

Assuming that a certain number of soft information tables were saved previously, the saved soft information tables can be default tables (e.g., those provided by the manufacturer) or soft information tables modified/generated during a previous power cycle.

Process 700 initiates when the system is powered on again. At 702, an initialization takes place, where the stored soft information tables are to be loaded from the NAND storage to the hierarchical storage (e.g., the controller's flip-flops, SRAM, RAM, etc.).

At 703, the accuracy granularity (which can be measured in terms of the number of tables that were saved previously if 704 occurs at initialization time, or the number of tables currently in use if 704 occurs during the SSD's normal operations) is evaluated. At 704, the accuracy granularity is used to determine whether there is sufficient amount of buffer memory to hold these soft information tables. If there is sufficient memory, the soft information tables are loaded into buffer memory at 718 and used during soft-decoding at 720.

If, however, there is insufficient controller memory to hold the soft information tables, more memory is allocated from host memory at 706 to meet the memory requirement of the soft information tables. In some embodiments, the soft information tables were previously categorized and/or ranked according to their access frequency, and the categorization and/or ranking data is stored as metadata and loaded during the initialization process. At 708, the soft information tables are placed in the appropriate locations in the hierarchical storage according to the categorization and/or ranking information. Specifically, more frequently accessed soft information tables are stored in lower latency memory and less frequently accessed soft information tables are stored in higher latency memory.

At 710, the soft information properties associated with at least some of the plurality of soft information tables are monitored during the course of the SSD's operations. For example, the access frequencies of the soft information tables and the operational data such as P/E cycles, data retention, read disturb, write disturb, calibration, and/or any other appropriate parameters are observed and their values are recorded as the SSD uses the soft information tables to perform soft decoding.

At 712, it is determined, based on soft decoding results, whether any of the soft information tables need to be updated. The determination and update are explained above in connection with 506 of FIG. 5. If no, the process continues at 714 where the locations of at least some of the soft information tables are adjusted according to the access frequencies. For example, the soft information tables are ranked according to the access frequencies, and the more frequently accessed soft information tables can be promoted to a lower latency memory while the less frequently accessed soft information tables can be demoted to a higher latency memory.

At 716, it is determined whether there are table movements due to changes in access frequencies. If so, the process returns to 703, where the accuracy granularity is evaluated to determine whether there is a sufficient amount of controller memory to hold the tables. If there is no table movement, the process proceeds to 720 and the soft information tables are used for soft-decoding normally.

At 722, a power off request is received. At 724, it is determined whether the power off request is a normal power off request where the SSD experiences an orderly shutdown. If the power off request is normal and the SSD will experience an orderly shutdown, data (e.g., user data) and current soft information tables (e.g., those soft information tables stored in the buffer portion of the hierarchical storage) are written into the NAND flash to be persisted, at 726. This way, the current soft information tables can be saved and reused next time the SSD is powered on. If, however, the power off request is not normal, the SSD will have limited charge and only data is written to the NAND flash, and the soft information tables are not written, at 728. Next time the SSD is powered on, default soft information tables are loaded and used.

Figure 8A:
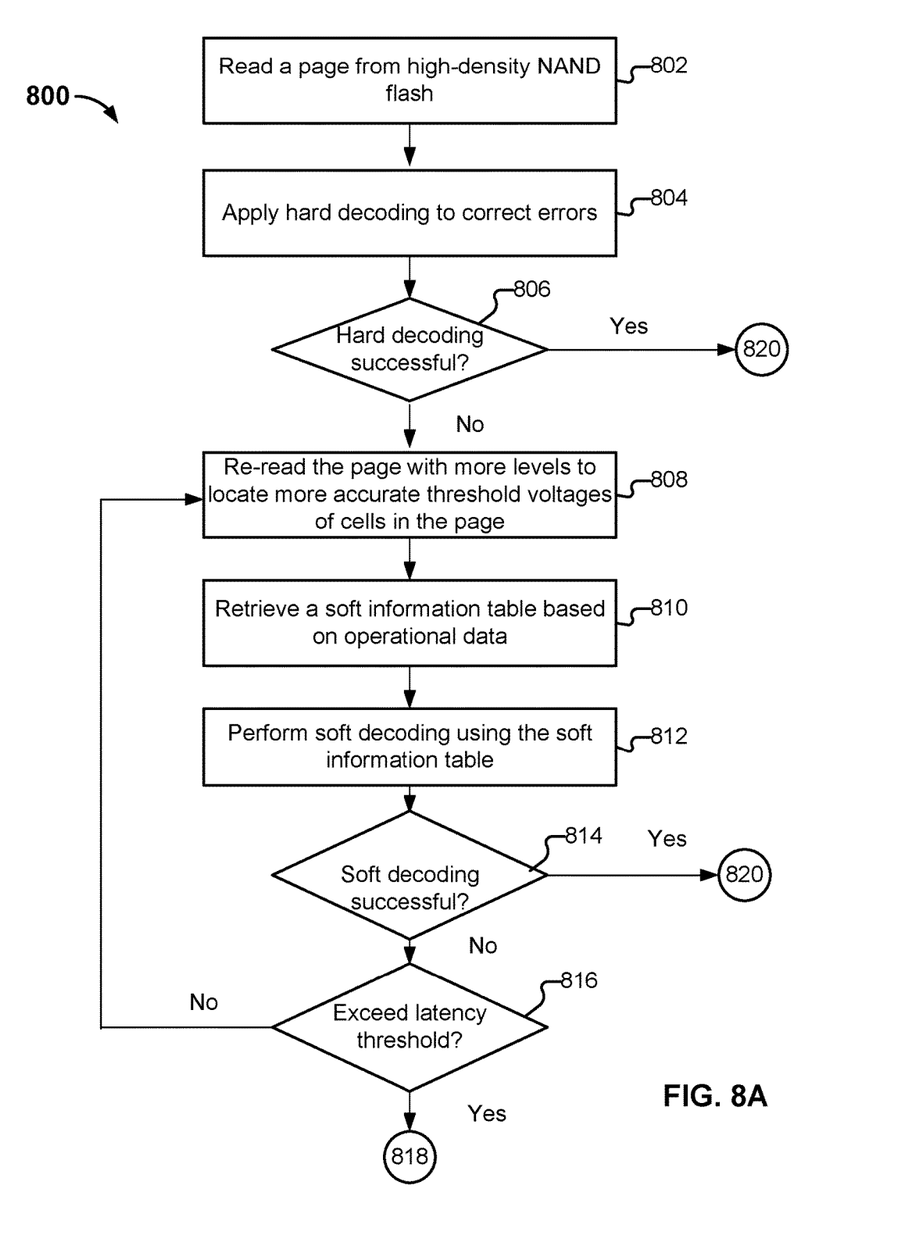
FIGS. 8A and 8B are a flowchart illustrating an embodiment of a process for reading data from an SSD comprising a high density NAND flash.
Figure 8B:
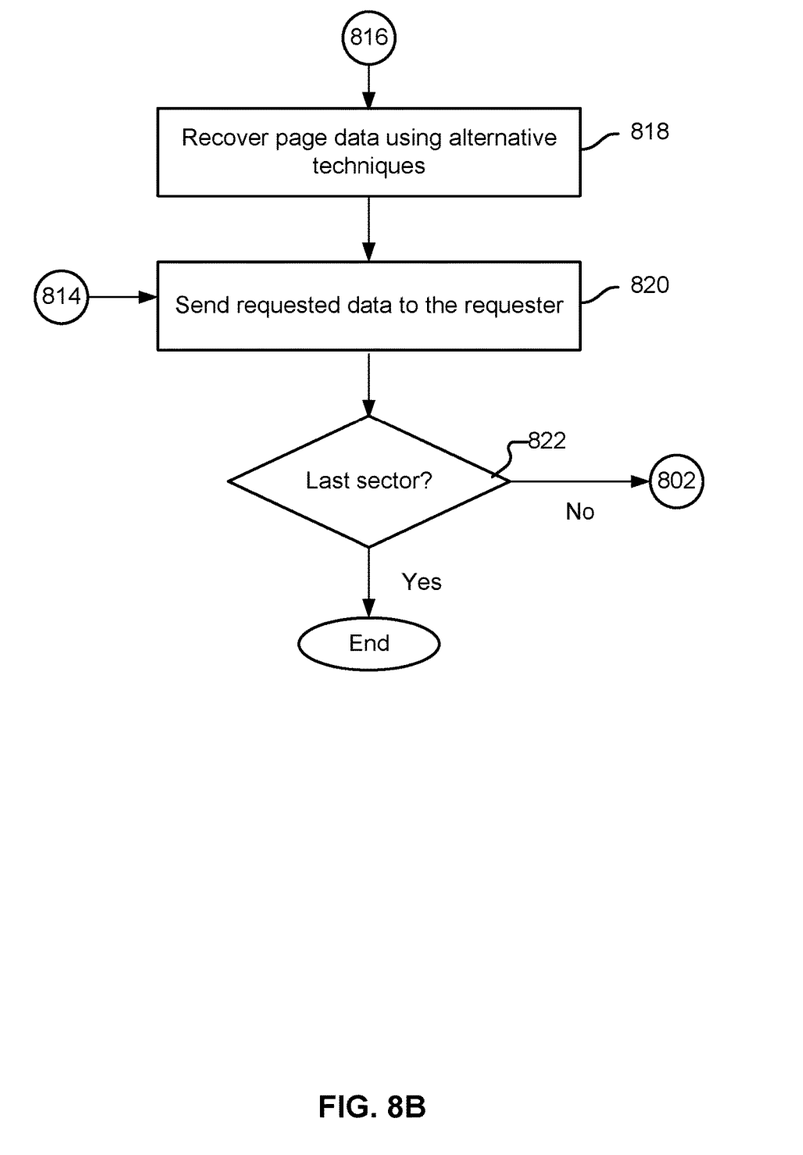

FIGS. 8A and 8B are a flowchart illustrating an embodiment of a process for reading data from an SSD comprising a high density NAND flash. Process 800 can be performed by a system such as 200.

At 802, a page is read from high-density NAND flash. In this example, a sensing voltage is applied to the cells' gates to determine the threshold voltages of cells in the page (and the stored data).

At 804, hard decoding is applied to the read data to correct errors. Any conventional hard decoding technique such a flood decoding or layer decoding can be used to determine the likely stored voltage in the cell and perform error correction.

At 806, it is determined whether the hard decoding was successful. In this example, the hard decoding function outputs an indication of whether the hard decoding is deemed to be successful. If hard decoding was successful, the requested data is sent out to the requester (e.g., a host application) at 820. If hard decoding was unsuccessful, at 808, the page is re-read with more levels to locate more accurate threshold voltages of cells in this page. For example, when 3 sensing levels are used instead of 1 hard sensing level, the threshold voltage range is divided into 4 finer-grained sub-regions.

At 810, a soft information table is retrieved from the soft information tables loaded in the controller memory. In this example, the operational data is used in conjunction with a CAM similar to Table 3 to access a location in a hierarchical storage where the soft information table is stored, using techniques described above.

At 812, soft decoding is performed for this page using the retrieved soft information table. Soft decoding techniques such as LDPC soft decoding can be applied.

At 814, it is determined whether the soft decoding process is successful. In this example, the soft decoding function outputs an indication of whether the soft decoding is successful. If so, the process proceeds to 820 to output the requested data to the requester. If soft decoding is unsuccessful, it is determined at 816 whether the decoding time exceeds a preconfigured latency threshold that ensures a service level agreement to the host. If the latency threshold is not exceeded, the process continues at 808, where the page is re-read with still more levels to locate more accurate threshold voltages of cells in this page. For example, if the page was previously read with four levels, the page can be re-read with eight levels at this point. 810-816 are also repeated. If, however, the latency threshold is exceeded, at 818, the data on this page is recovered using alternative techniques such as copying from a Redundant Array of Independent Disks (RAID) or a duplicate, or based on erasure coding (EC).

At 820, the requested data is sent out to the requester.

At 822, it is determined whether the sector is the last one to be read. If so, the process is completed; otherwise, the process returns to 802 where the next page is read from the high density NAND flash.

Managing soft information in a high-capacity SSD has been disclosed. By monitoring soft information parameters and updating soft information tables dynamically, more accurate soft information is provided to the soft decoder and greater decoding accuracy is achieved.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method, comprising:
   performing soft decoding of data read from a solid state drive (SSD) using at least some of a plurality of soft information tables, the plurality of soft information tables corresponding to different sets of soft information property data, each set of soft information property data comprising one or more soft information properties;
   monitoring a set of soft information property data associated with the at least some of the plurality of soft information tables;
   adjusting the at least some of the plurality of soft information tables based at least in part on the set of soft information property data to obtain one or more adjusted soft information tables; and
   repeating the soft decoding of the data read from the SSD, using at least the one or more adjusted soft information tables.

2. The method of claim 1, further comprising providing the adjusted soft information tables to perform additional soft decoding.

3. The method of claim 1, wherein the set of soft information property data includes a set of one or more access frequencies corresponding to the at least some of the plurality of soft information tables.

4. The method of claim 1, wherein:
the set of soft information property data includes a set of one or more access frequencies corresponding to the at least some of the plurality of soft information tables; and
the adjusting of the at least some of the plurality of soft information tables includes moving, based at least in part on the set of one or more access frequencies, the at least some of the plurality of soft information tables within a hierarchical storage.

5. The method of claim 1, wherein:
the set of soft information property data includes a set of one or more access frequencies corresponding to the at least some of the plurality of soft information tables;
the adjusting of the at least some of the plurality of soft information tables includes moving, based at least in part on the set of one or more access frequencies, the at least some of the plurality of soft information tables within a hierarchical storage, the hierarchical storage including a plurality of volatile memories having different latencies; and
the at least some of the plurality of soft information tables are moved within the hierarchical storage according to the set of one or more access frequencies.

6. The method of claim 4, wherein:
moving, based at least in part on the set of one or more access frequencies, the at least some of the plurality of soft information tables within the hierarchical storage including moving the at least some of the plurality of soft information tables from one storage location in the hierarchical storage into one or more of:
on-chip flip-flops included in a controller of the SSD;
a random access memory included in the controller of the SSD; and
a random access memory included in a host device coupled to the SSD.

7. The method of claim 1, wherein the set of soft information property data includes a set of operational data, the set of operational data including one or more of: program/erase cycles, read disturbs, write disturbs, data retention rate, and calibration.

8. The method of claim 1, wherein:
the set of soft information property data includes a set of operational data; and
the adjusting of the at least some of the plurality of soft information tables includes dynamically adjusting one or more of the plurality of soft information tables based at least in part on one or more corresponding soft decoding results.

9. The method of claim 1, wherein the performing of soft decoding of the data read from the SSD includes performing soft decoding of the data read from a high-density flash implemented using a 3-dimensional stacked design.

10. The method of claim 1, wherein the performing of the soft decoding of the data read from the SSD includes:
obtaining a set of input factors;
locating a corresponding soft information table based on the set of input factors; and
performing low-density parity-check (LDPC) decoding based at least in part on the corresponding soft information table.

11. The method of claim 1, wherein the adjusting of the at least some of the plurality of soft information tables includes accessing a content addressable memory (CAM) in which locations of soft information tables are addressable using corresponding operational data.

12. The method of claim 1, in the event that the SSD is to be powered off normally, further comprising writing error-corrected data and current soft information tables to a NAND flash included in the SSD.

13. A system, comprising:
a solid state drive (SSD); and
one or more processors coupled to the SSD, configured to:
perform soft decoding of data read from the SSD using at least some of a plurality of soft information tables, the plurality of soft information tables corresponding to different sets of soft information property data, each set of soft information property data comprising one or more soft information properties;
monitor a set of soft information property data associated with the at least some of the plurality of soft information tables;
adjust the at least some of the plurality of soft information tables based at least in part on the set of soft information property data to obtain one or more adjusted soft information tables; and
repeat the soft decoding of the data read from the SSD, using at least the one or more adjusted soft information tables.

14. The system of claim 13, wherein the one or more processors are further configured to provide the adjusted soft information tables to perform additional soft decoding.

15. The system of claim 13, wherein the set of soft information property data includes a set of one or more access frequencies corresponding to the at least some of the plurality of soft information tables.

16. The system of claim 13, wherein:
the set of soft information property data includes a set of one or more access frequencies corresponding to the at least some of the plurality of soft information tables; and
to adjust the at least some of the plurality of soft information tables includes to move, based at least in part on the set of one or more access frequencies, the at least some of the plurality of soft information tables within a hierarchical storage.

17. The system of claim 13, wherein:
the set of soft information property data includes a set of one or more access frequencies corresponding to the at least some of the plurality of soft information tables;
to adjust the at least some of the plurality of soft information tables includes to move, based at least in part on the set of one or more access frequencies, the at least some of the plurality of soft information tables within a hierarchical storage, the hierarchical storage including a plurality of volatile memories having different latencies; and
the at least some of the plurality of soft information tables are moved within the hierarchical storage according to the set of one or more access frequencies.

18. The system of claim 17, wherein:
the plurality of volatile memories includes one or more of:
on-chip flip-flops included in a controller of the SSD;
a random access memory included in the controller of the SSD; and a random access memory included in a host device coupled to the SSD.

19. The system of claim 13, wherein the set of soft information property data includes a set of operational data, the set of operational data including one or more of: program/erase cycles, read disturbs, write disturbs, data retention rate, and/or calibration.

20. The system of claim 13, wherein:
the set of soft information property data includes a set of operational data; and
the adjusting of the at least some of the plurality of soft information tables includes dynamically adjusting one or more of the plurality of soft information tables based at least in part on one or more corresponding soft decoding results.

21. The system of claim 13, wherein to perform soft decoding of the data read from the SSD includes to perform soft decoding of the data read from a high-density flash implemented using a 3-dimensional stacked design.

22. The system of claim 13, wherein to perform the soft decoding of the data read from the SSD includes to:
obtain a set of input factors;
locate a corresponding soft information table based on the set of input factors; and
perform low-density parity-check (LDPC) decoding based at least in part on the corresponding soft information table.

23. The system of claim 13, wherein to adjust the at least some of the plurality of soft information tables includes to access a content addressable memory (CAM) in which locations of soft information tables are addressable using corresponding operational data.

24. The system of claim 13, in the event that the SSD is to be powered off normally, further comprising writing error-corrected data and current soft information tables to a NAND flash included in the SSD.

25. A computer program product for managing soft information, the computer program product being embodied in a tangible non-transitory computer readable storage medium and comprising computer instructions for:
performing soft decoding of data read from a solid state drive (SSD) using at least some of a plurality of soft information tables, the plurality of soft information tables corresponding to different sets of soft information data property data, each set of soft information property data comprising one or more soft information properties;
monitoring a set of soft information property data associated with the at least some of the plurality of soft information tables;
adjusting the at least some of the plurality of soft information tables based at least in part on the set of soft information property data to obtain one or more adjusted soft information tables; and
repeating the soft decoding of the data read from the SSD, using at least the one or more adjusted soft information tables.

26. A controller, comprising:
a processor configured to:
perform soft decoding of data read from a solid state drive (SSD) using at least some of a plurality of soft information tables, including accessing the at least some of the plurality of soft information tables stored in a hierarchical storage;
on-chip flip-flops coupled to the processor; and
a random access memory coupled to the processor;
wherein the at least some of the plurality of soft information tables are stored in the hierarchical storage, and the hierarchical storage comprises two or more of:
the on-chip flip-flops included in the controller of the SSD;
the random access memory included in the controller of the SSD; and
random access memory included in a host device coupled to the SSD.

* * * * *

UNITED STATES PATENT AND TRADEMARK OFFICE
CERTIFICATE OF CORRECTION

PATENT NO. : 10,263,639 B2
APPLICATION NO. : 15/426725
DATED : April 16, 2019
INVENTOR(S) : Shu Li Page 1 of 1

It is certified that error appears in the above-identified patent and that said Letters Patent is hereby corrected as shown below:

In the Claims

In Column 14, Claim 26, Line 36, before "random", insert --a--.

Signed and Sealed this
Third Day of December, 2019

Andrei Iancu
*Director of the United States Patent and Trademark Office*